United States Patent
Amberg et al.

[11] Patent Number: 5,989,061
[45] Date of Patent: Nov. 23, 1999

[54] LOW PROFILE BACKPLANE JUMPER BOARD

[75] Inventors: Mark F. Amberg, Littleton; Charles R. Lindemulder, Denver; Michael L. Nienaber, Berthoud, all of Colo.

[73] Assignee: Lucent Technologies Inc., Murray Hill, N.J.

[21] Appl. No.: 09/236,849

[22] Filed: Jan. 25, 1999

[51] Int. Cl.$^6$ .................................................. H01R 31/08
[52] U.S. Cl. ...................... 439/510; 439/510; 439/507; 439/512; 439/189
[58] Field of Search ............................... 439/189, 507, 439/510, 512

[56]  References Cited

U.S. PATENT DOCUMENTS

| | | | |
|---|---|---|---|
| 3,296,362 | 1/1967 | Parry . | |
| 4,179,173 | 12/1979 | Rise, III | 339/19 |
| 5,112,238 | 5/1992 | Cizin | 439/188 |
| 5,282,112 | 1/1994 | Bremer | 361/729 |
| 5,609,493 | 3/1997 | Cheng et al. | 439/157 |
| 5,655,930 | 8/1997 | Dechelette et al. | 439/571 |
| 5,711,681 | 1/1998 | Hasegawa | 439/86 |
| 5,810,617 | 9/1998 | Hasagawa | 439/510 |

*Primary Examiner*—Paula Bradley
*Assistant Examiner*—Truc Nguyen
*Attorney, Agent, or Firm*—Duft,Graziano&Forest,P.C.

[57]  ABSTRACT

The low profile backplane jumper board is mounted over the connector pins on the circuit pack side of the backplane to thereby selectively interconnect designated conductors in the connectors. These interconnections among connector conductors can be within a single connector or can span multiple connecters. The low profile backplane jumper board comprises a circuit board that contains holes for each of the backplane connector pins over which it is inserted. The ones of these holes that require an electrical connection to the associated backplane connector conductor are filled with a miniature spring socket assembly contact which is soldered to or press fit into the plated hole and associated conductors formed on the surface of the circuit board to interconnect a plurality of the holes formed in the circuit board. The thickness of the circuit board is selected to be of sufficient thinness to not interfere with the connection of the circuit packs to the associated connectors.

8 Claims, 2 Drawing Sheets

LOW PROFILE BACKPLANE JUMPER BOARD

FIELD OF THE INVENTION

This invention relates to printed circuit board carriers that use circuit pack connectors to electrically interconnect a plurality of circuit packs to a set of backplane wiring and, in particular, to a low profile backplane jumper board that functions to interconnect selected conductors of the plurality of circuit pack connectors without requiring a significant amount of space in the circuit board carrier or the expenditure of a significant amount of labor in the installation of the low profile backplane jumper board.

PROBLEM

In printed circuit board carriers it is a problem to implement circuit wiring changes into the backplane wiring and circuit pack connectors to accommodate changes in the circuitry that is mounted on the circuit packs that are installed in the circuit board carrier. In particular, there is typically little space either between the backplane and the physical cabinet that is used to house the printed circuit board carrier or between the backplane and the circuit packs that are mounted in the circuit pack connectors. This lack of space prevents the use of jumper cables or extensive manually inserted wiring to interconnect selected conductors in the plurality of circuit pack connectors. In addition, the use of manually installed wiring, on a per wire basis, is expensive, prone to error, and typically requires access to connector pins to ensure physically secure jumper wire mounting. Furthermore, the circuit pack connector side of the backplane cannot be used for jumper cables or wiring since this would interfere with the proper installation of the circuit packs on their associated circuit pack connectors. Therefore, the addition of jumper wires to a printed circuit board carrier to accommodate design changes in the circuit packs that are mounted therein is an option of limited applicability and is sometimes unavailable for some printed circuit board carrier applications, thereby preventing the use of desired design changes in the circuit packs.

SOLUTION

The above described problems are solved and a technical advance achieved by the present low profile backplane jumper board that is mounted over the circuit pack connector pins on the circuit pack side of the backplane to thereby selectively interconnect designated conductors in the circuit pack connectors. These interconnections among circuit pack connector conductors can be within a single circuit pack connector or can span multiple circuit pack connectors.

The low profile backplane jumper board comprises a thin circuit board that contains holes for each of the backplane circuit pack connector pins over which it is inserted. The ones of these holes that require an electrical connection to the associated backplane circuit pack connector conductor are filled with a miniature spring socket assembly contact which is soldered to or press fit into the plated hole and associated conductors formed on the surface of the low profile backplane jumper board to interconnect a plurality of the holes formed in the low profile backplane jumper board. The thickness of the low profile backplane jumper board is selected to not interfere with the connection of the circuit packs to the associated circuit pack connectors. The miniature spring socket assembly contact can protrude out the backplane side of the low profile backplane jumper board, since the circuit pack connector housing into which it protrudes contains a sufficient size recess formed around the corresponding circuit pack connector pin to receive the protruding contact. The low profile backplane jumper board can also include elements to match the impedance with the backplane elements to thereby minimize signal degradation which is inherent in the use of any jumper. The low profile backplane jumper board is physically maintained in place by the friction force of the miniature spring socket assembly contact acting on the associated circuit pack connector pins as well as the presence of the circuit packs, which prevent the removal of the low profile backplane jumper board.

DETAILED DESCRIPTION

Figure 1:
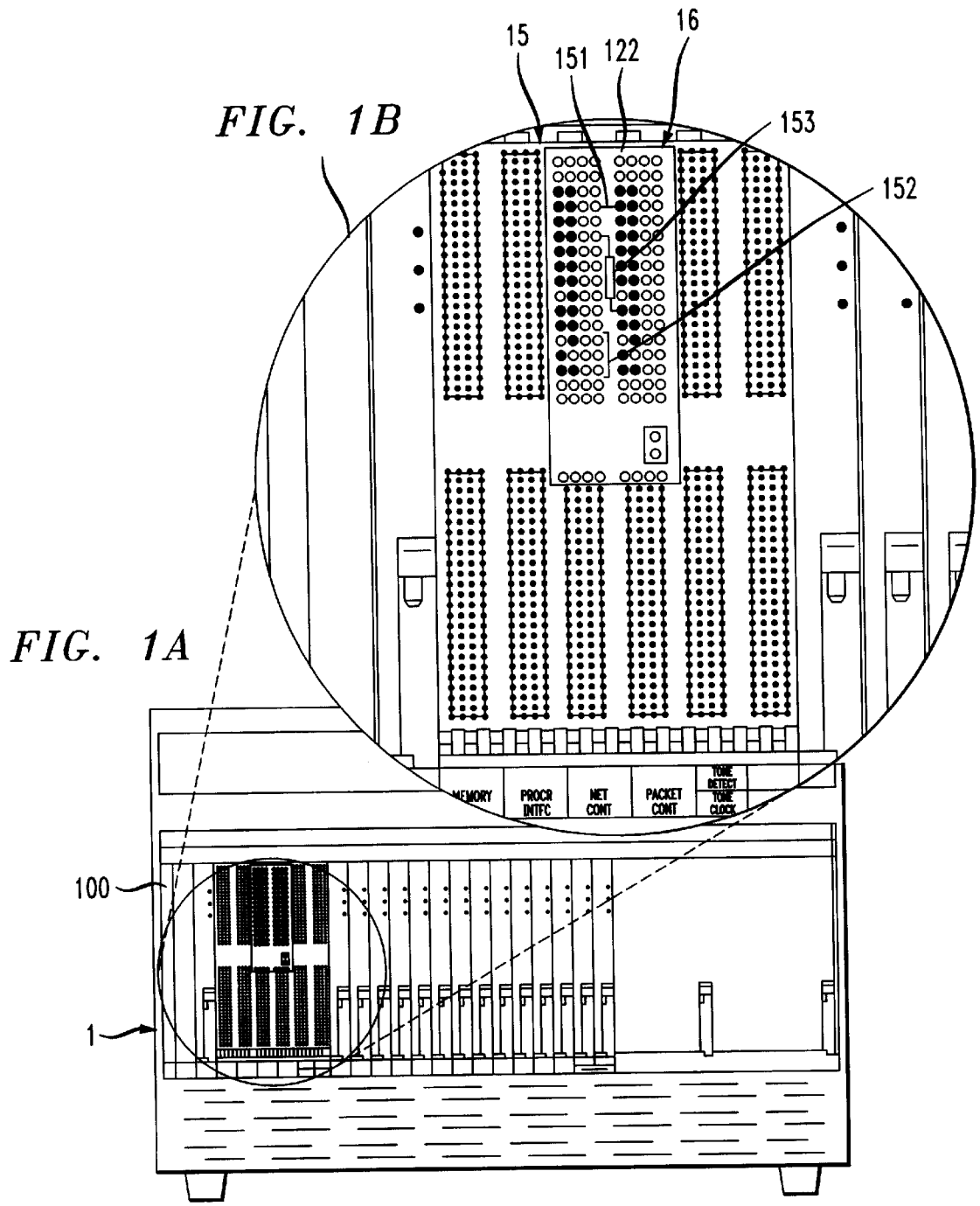
FIGS. 1A and 1B illustrate a front plan view of a printed circuit board carrier with one embodiment of the present low profile backplane jumper board installed therein to span two circuit pack locations that are presently not equipped with circuit packs.
Figure 2:
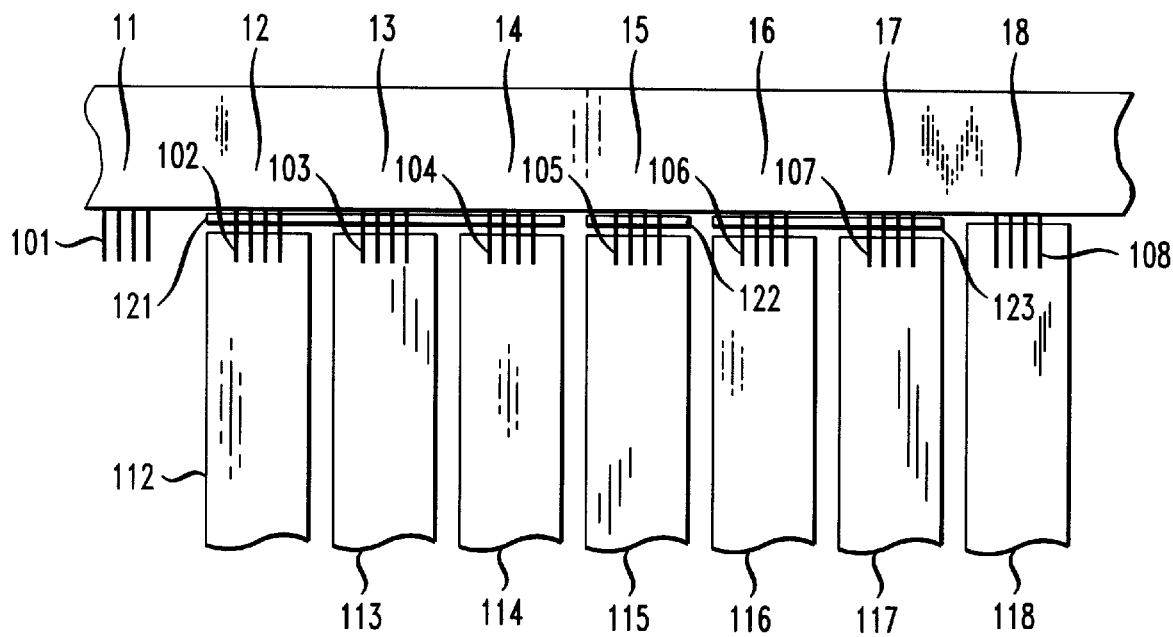
FIG. 2 illustrates a top plan view of the backplane of the printed circuit board carrier, with a plurality of embodiments of the present low profile backplane jumper board installed therein between the circuit packs and the backplane.
Figure 3:
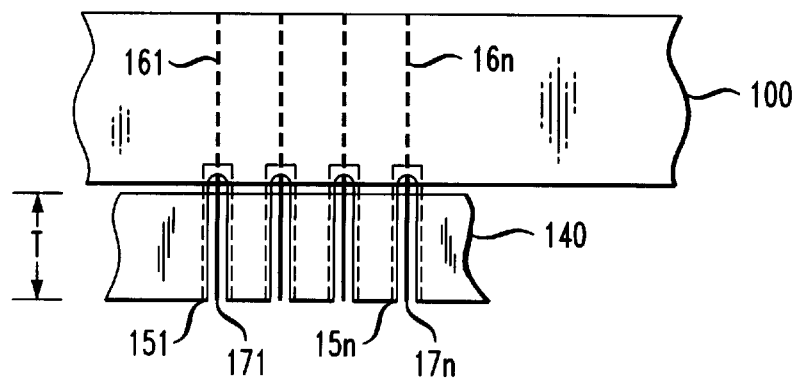
FIG. 3 illustrates in cross-section view addition detail of the interconnection of a low profile backplane jumper board to the backplane.

FIGS. 1A and 1B illustrate a front plan view of a printed circuit board carrier 1 with one embodiment of the present low profile backplane jumper board 122 installed therein to span two circuit pack locations 15, 16 that are presently not equipped with circuit packs. FIG. 2 illustrates a top plan view of the backplane 100 of the printed circuit board carrier 1, with a plurality of embodiments of the present low profile backplane jumper board 121–123 installed therein between the circuit packs 112–118 and the backplane 100. FIG. 3 illustrates in cross-section view addition detail of the interconnection of a low profile backplane jumper board 122 to the backplane 100.

The backplane 100 is mounted in a circuit pack carrier 1 and typically comprises a rectangular shaped circuit board having a first side and an opposing second side. The first side (circuit pack side shown in FIGS. 1A and 1B) has mounted thereon a plurality of sets of pin conductors 101–108 that protrude substantially perpendicularly from the first side. Each set of pin conductors 101–108 is configured to receive a mating set of conductors mounted on a circuit pack for establishing electrical connections between circuitry on said circuit pack and conductors on said backplane 100. The second side typically has formed thereon printed circuit board wiring to interconnect the pin conductors in the plurality of sets of pin conductors 101–108 according to a predetermined wiring plan. The low profile backplane jumper board 122 is mounted over the circuit pack connector pins 105, 106 on the circuit pack side of the backplane 100 to thereby selectively interconnect designated conductors in the circuit pack connectors 15,16. These interconnections among circuit pack connector conductors can be within a single circuit pack connector 17 as shown by low profile backplane jumper board 123 or can span multiple circuit pack connecters 12–14 and 15–16 as shown by low profile backplane jumper boards 121,122, respectively. The low profile backplane jumper board 122 comprises a circuit board 140 that contains holes 151–15n for each of the backplane circuit pack connector pins 161–16n over which the low profile backplane jumper board 122 is inserted. The ones of these holes 151–15n that require an electrical connection to the associated backplane circuit pack connector pins 161–16n are filled with a miniature spring socket assembly contact 171–17n which is soldered to or press fit into the plated hole 151–15n and associated conductors 151, 152 formed on the surface of the circuit board 140 to interconnect plurality of the holes 151–15n formed in the circuit board 140. The thickness T of the circuit board 140 is selected to be of sufficient thinness to not interfere with the connection of the circuit packs 112–118 to the associated circuit pack connectors 102–108. The miniature spring socket assembly contact 171–17n can protrude out the backplane side of the low profile backplane jumper board 122, since the circuit pack connector housing into which it protrudes contains a sufficient size recess formed around the corresponding circuit pack connector pins 161–16n to receive the protruding contact. The low profile backplane jumper board 122 can also include elements 153 to match the impedance with the backplane elements to thereby minimize signal degradation which is inherent in the use of any jumper. The low profile backplane jumper board 122 is physically maintained in place by the friction force of the miniature spring socket assembly contact 171–17n acting on the associated circuit pack connector pins 161–16n as well as the presence of the circuit packs, which prevent the removal of the low profile backplane jumper board 122.

What is claimed:

1. In a backplane that has a first side and a second opposing side, and having mounted on said first side thereof a plurality of sets of pin conductors, each said set of pin conductors being configured to receive a mating set of conductors that are mounted on a circuit pack, said set of pin conductors establishing electrical connections between circuitry on said circuit pack and conductors on said backplane, a jumper apparatus for interconnecting predetermined ones of said pin conductors comprising:

means, mountable juxtaposed to said first side of said backplane, having a plurality of holes formed therein in a configuration corresponding to a like plurality of said pin conductors, for receiving said like plurality of pin conductors;

at least one electrical conductor formed on said means for receiving for electrically interconnecting at least two of said like plurality of pin conductors; and socket means, mounted in selected ones of said plurality of holes and connected to said at least one electrical conductor formed on said means for receiving, for electrically interconnecting said at least one electrical conductor to said at least two of said like plurality of pin conductors.

2. The jumper apparatus of claim 1 wherein each set of said plurality of sets of pin conductors comprises a circuit pack connector, said means for receiving spans a plurality of said sets of pin conductors, said at least one electrical conductor comprises:

electrical conductors formed on said means for receiving for interconnecting a first pin conductor in a first set of said spanned plurality of said sets of pin conductors with a second pin conductor in a second set of said spanned plurality of said sets of pin conductors.

3. The jumper apparatus of claim 1 wherein each set of said plurality of sets of pin conductors comprises a circuit pack connector, said means for receiving spans a single one of said sets of pin conductors, said at least one electrical conductor comprises:

electrical conductors formed on said means for receiving for interconnecting a first pin conductor in said one set of said spanned set of pin conductors with a second pin conductor in said one set of said spanned set of said sets of pin conductors.

4. The jumper apparatus of claim 1 further comprising:

circuit means, connected to said at least one electrical conductor formed on said means for receiving, for electrically interconnecting said circuit means to at least one of said at least two of said like plurality of pin conductors.

5. In a backplane that has a first side and a second opposing side, and having mounted on said first side thereof and protruding perpendicularly from said first side a plurality of sets of pin conductors, each said set of pin conductors being configured to receive a mating set of conductors mounted on a circuit pack for establishing electrical connections between circuitry on said circuit pack and conductors on said backplane, a jumper apparatus for interconnecting predetermined ones of said pin conductors comprising:

circuit board means, mountable juxtaposed to said first side of said backplane wiring apparatus between said backplane wiring apparatus and at least one circuit pack mounted on one of said plurality of sets of pin conductors, having a plurality of holes formed therein in a configuration corresponding to a like plurality of said pin conductors, for receiving said like plurality of pin conductors;

socket means, mounted in selected ones of said plurality of holes formed in said circuit board means for receiving corresponding ones of said pin conductors, for electrically interconnecting said at least one electrical conductor to said socket means; and at least one electrical conductor formed on said means for receiving for electrically interconnecting at least two of said socket means.

6. The jumper apparatus of claim 5 wherein each set of said plurality of sets of pin conductors comprises a circuit pack connector, said means for receiving spans a plurality of said sets of pin conductors, said at least one electrical conductor comprises:

electrical conductors formed on said means for receiving for interconnecting a first pin conductor in a first set of said spanned plurality of said sets of pin conductors with a second pin conductor in a second set of said spanned plurality of said sets of pin conductors.

7. The jumper apparatus of claim 5 wherein each set of said plurality of sets of pin conductors comprises a circuit pack connector, said means for receiving spans a single one of said sets of pin conductors, said at least one electrical conductor comprises:

electrical conductors formed on said means for receiving for interconnecting a first pin conductor in said one set of said spanned set of pin conductors with a second pin conductor in said one set of said spanned set of said sets of pin conductors.

8. The jumper apparatus of claim 5 further comprising:

circuit means, connected to said at least one electrical conductor formed on said means for receiving, for electrically interconnecting said circuit means to at least one of said at least two of said like plurality of pin conductors.

* * * * *